(12) United States Patent
Pei et al.

(10) Patent No.: US 8,927,378 B2
(45) Date of Patent: Jan. 6, 2015

(54) TRENCH SILICIDE CONTACT WITH LOW INTERFACE RESISTANCE

(71) Applicant: International Business Machines Corporation, Armonk, NY (US)

(72) Inventors: Chengwen Pei, Danbury, CT (US); Jeffrey B. Johnson, Essex Junction, VT (US); Zhengwen Li, Danbury, CT (US); Jian Yu, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 29 days.

(21) Appl. No.: 13/772,954

(22) Filed: Feb. 21, 2013

(65) Prior Publication Data

US 2013/0171795 A1 Jul. 4, 2013

Related U.S. Application Data

(62) Division of application No. 12/944,018, filed on Nov. 11, 2010, now abandoned.

(51) Int. Cl.
| | |
|---|---|
| *H01L 29/72* | (2006.01) |
| *H01L 21/768* | (2006.01) |
| *H01L 21/265* | (2006.01) |
| *H01L 21/285* | (2006.01) |
| *H01L 23/485* | (2006.01) |
| *H01L 29/417* | (2006.01) |
| *H01L 29/66* | (2006.01) |
| *H01L 29/51* | (2006.01) |

(52) U.S. Cl.
CPC .... *H01L 21/76879* (2013.01); *H01L 21/26586* (2013.01); *H01L 21/28518* (2013.01); *H01L 21/76805* (2013.01); *H01L 23/485* (2013.01); *H01L 29/41766* (2013.01); *H01L 29/66636* (2013.01); *H01L 29/517* (2013.01); *H01L 29/66545* (2013.01)
USPC ............................................ 438/303; 438/294

(58) Field of Classification Search
CPC .................. H01L 21/76232; H01L 21/823481
USPC .................................................. 438/294, 303
See application file for complete search history.

(56) References Cited

U.S. PATENT DOCUMENTS

| | | |
|---|---|---|
| 4,477,310 A | 10/1984 | Park et al. |
| 4,486,266 A | 12/1984 | Yamaguchi |

(Continued)

OTHER PUBLICATIONS

U.S. Office Action dated Apr. 11, 2013 issued in U.S. Appl. No. 12/944,018.

(Continued)

*Primary Examiner* — Edward Wojciechowicz
(74) *Attorney, Agent, or Firm* — Scully, Scott, Murphy & Presser, P.C.; H. Daniel Schnurmann

(57) ABSTRACT

An electrical structure is provided that includes a dielectric layer present on a semiconductor substrate and a via opening present through the dielectric layer.
An interconnect is present within the via opening. A metal semiconductor alloy contact is present in the semiconductor substrate. The metal semiconductor alloy contact has a perimeter defined by a convex curvature relative to a centerline of the via opening. The endpoints for the convex curvature that defines the metal semiconductor alloy contact are aligned to an interface between a sidewall of the via opening, a sidewall of the interconnect and an upper surface of the semiconductor substrate.

20 Claims, 4 Drawing Sheets

(56) References Cited

U.S. PATENT DOCUMENTS

| | | | |
|---|---|---|---|
| 5,120,571 A | 6/1992 | Gill et al. | |
| 5,296,397 A | 3/1994 | Lee | |
| 5,610,099 A | 3/1997 | Stevens et al. | |
| 5,739,573 A * | 4/1998 | Kawaguchi | 257/384 |
| 6,664,143 B2 | 12/2003 | Zhang | |
| 6,770,942 B2 | 8/2004 | Iinuma | |
| 6,794,721 B2 | 9/2004 | Clevenger et al. | |
| 6,933,189 B2 | 8/2005 | Clevenger et al. | |
| 6,946,371 B2 | 9/2005 | Langdo et al. | |
| 7,049,222 B2 | 5/2006 | Iinuma | |
| 7,122,449 B2 | 10/2006 | Langdo et al. | |
| 7,217,603 B2 | 5/2007 | Currie et al. | |
| 7,256,142 B2 | 8/2007 | Fitzgerald | |
| 7,420,201 B2 | 9/2008 | Langdo et al. | |
| 7,439,164 B2 | 10/2008 | Langdo et al. | |
| 7,501,351 B2 | 3/2009 | Fitzgerald | |
| 7,504,704 B2 | 3/2009 | Currie et al. | |
| 7,615,829 B2 | 11/2009 | Lochtefeld et al. | |
| 7,678,662 B2 | 3/2010 | Arghavani et al. | |
| 2008/0079090 A1 * | 4/2008 | Hwang et al. | 257/384 |

OTHER PUBLICATIONS

Final Official Action dated Sep. 12, 2013 in U.S. Appl. No. 12/944,018.

* cited by examiner

TRENCH SILICIDE CONTACT WITH LOW INTERFACE RESISTANCE

CROSS REFERENCE TO RELATED APPLICATIONS

This application is a divisional of U.S. Ser. No. 12/944,018, filed Nov. 11, 2010, the entire content and disclosure of which is incorporated herein by reference.

BACKGROUND

The present disclosure relates to semiconductor devices. More particularly, the present disclosure relates to metal semiconductor alloy contacts to semiconductor devices.

For more than three decades, the continued miniaturization of metal oxide semiconductor field effect transistors (MOS-FETs) has driven the worldwide semiconductor industry. Various showstoppers to continued scaling have been predicated for decades, but a history of innovation has sustained Moore's Law in spite of many challenges. Since it has become increasingly difficult to improve MOSFETs and therefore complementary metal oxide semiconductor (CMOS) performance through continued scaling, methods for improving performance without scaling are being considered. One approach for doing this is to increase carrier (electron and/or hole) mobilities.

SUMMARY

In one embodiment, an electrical structure is provided that includes a dielectric layer present on a semiconductor substrate. A via opening is present through the dielectric layer. An interconnect is present within the via opening to a metal semiconductor alloy contact that is present in the semiconductor substrate. The metal semiconductor alloy contact has a perimeter defined by a convex curvature relative to a centerline of the via opening. The endpoints for the convex curvature that define the metal semiconductor alloy contact are aligned to an interface between a sidewall of the via opening, a sidewall of the interconnect and an upper surface of the semiconductor substrate.

In another embodiment, a semiconductor device is provided that includes a gate structure on a channel portion of a semiconductor substrate. A source region and a drain region are present on opposing sides of the channel portion of the semiconductor substrate. A dielectric layer is present on the semiconductor substrate, the source region, the drain region and the gate structure. An interconnect is present extending through the dielectric layer into contact with a metal semiconductor alloy contact that is in electrical communication with at least one of the source region and the drain region. The metal semiconductor alloy contact has a convex curvature that extends into at least one of the source region and the drain region, wherein endpoints for the convex curvature that defines the metal semiconductor alloy contact are aligned to an interface between a sidewall of the interconnect and an upper surface of the semiconductor substrate.

In another aspect, a method of forming a semiconductor device is provided that includes forming a gate structure on a channel portion of a semiconductor substrate, wherein a source region and a drain region are present on opposing sides of the channel portion of the semiconductor substrate. A dielectric layer is formed over the gate structure. A via opening is formed through the dielectric layer to form an exposed surface of the semiconductor substrate containing at least one of the source region and the drain region. An amorphous region is formed in the semiconductor substrate by an angled ion implantation through the via opening into the exposed surface of the semiconductor substrate. The amorphous region is removed to form a divot having a convex curvature relative to the centerline of the via opening. A metal-containing material is formed on the divot. The metal-containing material and a portion of the semiconductor substrate adjacent to the divot are converted into a metal semiconductor alloy contact. The metal semiconductor contact has a convex curvature that extends into at least one of the source region and the drain region. The endpoints for the convex curvature that defines the metal semiconductor alloy contact are aligned to an interface between a sidewall of the via opening and an upper surface of the semiconductor substrate. An interconnect is formed within the via opening in direct contact with the metal semiconductor alloy contact.

DESCRIPTION OF THE SEVERAL VIEWS OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Figure 1:
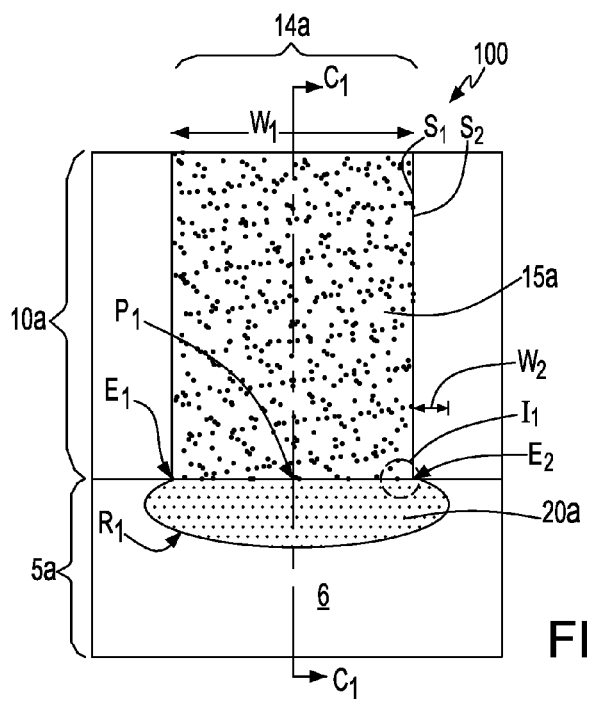
FIG. 1 is a side cross-sectional view of a contact to a doped region in a semiconductor substrate, in which the contact is composed of a metal semiconductor alloy and has a perimeter defined by a convex curvature, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

The present disclosure relates to metal semiconductor alloy contacts. A "metal semiconductor alloy" is an alloy of a metal and semiconductor. An alloy is homogeneous mixture or solid solution, in which the atoms of the metal are replacing or occupying interstitial positions between the atoms of the semiconductor.

The metal semiconductor alloy contacts may be formed to semiconductor devices, such as field effect transistors (FETS). A field effect transistor (FET) is a semiconductor device in which output current, i.e., source-drain current, is controlled by the voltage applied to a gate structure. A field effect transistor (FET) has three terminals, i.e., a gate structure, a source and a drain region. The gate structure is a structure used to control output current, i.e., flow of carriers in the channel portion, of a semiconducting device, such as a field effect transistor (FET), through electrical or magnetic fields. The channel portion of the substrate is the region between the source region and the drain region of a semiconductor device that becomes conductive when the semiconductor device is turned on. The source region is a doped region in the semiconductor device, in which majority carriers are flowing into the channel portion. The drain region is the doped region in semiconductor device located at the end of the channel portion, in which carriers are flowing out of the semiconductor device through the drain region.

When forming semiconductor devices, such as field effect transistors, using replacement gate methods, the metal semiconductor alloy contacts to the source and drain regions of the semiconductor device are typically formed in a trench, i.e., via opening, that extends through a dielectric layer. The dielectric layer also provides the opening to the channel portion of the semiconductor substrate that contains the functioning gate structure, once the sacrificial gate has been removed. It has been determined that forming metal semiconductor alloy contacts on the upper surface of the source region and the drain region that is defined by the trench opening results in increased resistance of the contact to the channel portion of the substrate. More specifically, in comparison to metal semiconductor alloy contacts that are not confined within the trench, and extend along an entire upper surface of the source and drain regions substantially to the sidewall of the gate structure, metal semiconductor alloy contacts that are contained within trenches increase the resistance of the contact. The metal semiconductor alloy contacts that are contained within trenches have an increased resistance, because a semiconductor region that is free of higher conductivity metal is present between the metal semiconductor alloy contact that is contained within the trench and the channel portion of the semiconductor device. In one embodiment, the present disclosure provides a lower resistance contact to a doped region of a semiconductor substrate by forming a metal semiconductor alloy contact having a convex curvature, as depicted in FIG. 1.

FIG. 1 depicts one embodiment of an electrical structure 100 that includes a dielectric layer 10a present on a semiconductor substrate 5a, and an interconnect 15a present extending through the dielectric layer 10a into contact with a doped region 6 of the semiconductor substrate 5a. Electrical communication between the interconnect 15a and the doped region 6 of the semiconductor substrate 5a may be provided by a metal semiconductor alloy contact 20a that has a perimeter defined by a convex curvature $R_1$.

Although, the present disclosure provides details concerning forming contact structures to the source region and the drain regions of a field effect transistor (FET), the metal semiconductor alloy contacts 20a disclosed herein may provide electrical communication to any electrical device including, but not limited to, memory devices, resistors, diodes, capacitors, and other semiconductor devices, such as finFETs, Schottky barrier MOSFETS and bipolar junction transistors.

The semiconductor substrate 5a may be composed of a silicon containing material. Si-containing materials include, but are not limited to, Si, single crystal Si, polycrystalline Si, SiGe, single crystal silicon germanium, polycrystalline silicon germanium, or silicon doped with carbon, amorphous Si and combinations and multi-layers thereof. The semiconductor substrate 5a is not limited to only silicon containing materials, as the semiconductor substrate 5a may be composed of any semiconducting material, such as compound semiconductors including Ge, GaAs, InAs and other like semiconductors. In the example, that is depicted in FIG. 1, the semiconductor substrate 5a is a bulk-semiconductor substrate. Although not depicted in FIG. 1, the semiconductor substrate 5a may include layered semiconductors, such as Si/Ge and Silicon-On-Insulators.

The semiconductor substrate 5a may include a doped region 6, which may also be referred to as a well. A doped region 6 is formed in the semiconductor substrate 5a by adding dopant atoms to an intrinsic semiconductor, which changes the electron and hole carrier concentrations of the intrinsic semiconductor at thermal equilibrium. The doped region may be p-type or n-type. As used herein, "p-type" refers to the addition of impurities to an intrinsic semiconductor that creates deficiencies of valence electrons. In a silicon-containing substrate, examples of p-type dopants, i.e., impurities, include but are not limited to boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to, antimony, arsenic and phosphorous. The dopant may be introduced by ion implantation or may be introduced to the semiconductor substrate 5 in situ. In situ means that the dopant is introduced during the process sequence that forms the material layers that provide the semiconductor substrate 5a. In one embodiment, in which the dopant region 6 is implanted with arsenic or phosphorus for an n-type semiconductor device, such as an n-type field effect transistor (nFET), the dopant concentration of the dopant region may range from $1\times10^{18}$ atoms/cm$^3$ to $5\times10^{21}$ atoms/cm$^3$. In another embodiment, in which the dopant region 6 is implanted with arsenic or phosphorus for an n-type semiconductor device, such as an n-type field effect transistor (nFET), the dopant concentration of the dopant region may range from $1\times10^{19}$ atoms/cm$^3$ to $1\times10^{21}$ atoms/cm$^3$. In another embodiment, in which the dopant region 6 is implanted with boron or BF$_2$ for a p-type semiconductor device, such as a p-type field effect transistor (pFET), the dopant concentration of the dopant region may range from $1\times10^{18}$ atoms/cm$^3$ to $5\times10^{21}$ atoms/cm$^3$. In another embodiment, in which the dopant region 6 is implanted with boron or BF$_2$ for a p-type semiconductor device, such as a p-type field effect transistor (pFET), the dopant concentration of the dopant region may range from $1\times10^{19}$ atoms/cm$^3$ to $1\times10^{21}$ atoms/cm$^3$.

In one embodiment, the semiconductor substrate 5a is composed of a single crystal material, such as single crystal silicon. As used herein, the term "single crystal" denotes a crystalline solid, in which the crystal lattice of the entire sample is substantially continuous and substantially unbroken to the edges of the sample, with substantially no grain boundaries. In another example, the source and drain area of the semiconductor substrate 5a of could be a polycrystalline material, such as polysilicon.

A dielectric layer 10a may be formed atop the semiconductor substrate 5a. The dielectric layer 10aa may be composed of any dielectric material including, but not limited to, oxides, nitrides, oxynitrides, and combinations thereof. In one example, the dielectric layer 10a is composed of silicon nitride. The dielectric layer 10a may also be composed of silicon oxide (SiO$_2$). Other examples of materials that are suitable for the dielectric layer 10a include silicon containing dielectric materials, such as Si$_3$N$_4$, SiO$_x$N$_y$, SiC, SiCO, SiCOH, and SiCH compounds, the above-mentioned silicon containing materials with some or all of the Si replaced by Ge, carbon-doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC, also known as amorphous hydrogenated carbon, α-C:H). Additional choices for the dielectric layer 10a include any of the aforementioned materials in porous form, or in a form that changes during processing to or from being porous and/or permeable to being non-porous and/or non-permeable. The dielectric layer 10a may have a thickness ranging from 20 nm to 100 nm.

An interconnect 15a is present in a via opening 14a through the dielectric layer 10a. The via opening 14a may have a width W1 ranging from 10 nm to 60 nm. In another embodiment, the via opening 14a may have a width W1 ranging from 20 nm to 40 nm. The via opening 14a exposes an upper surface of the portion of the semiconductor substrate 5a in which the doped region 6 is present.

The interconnect 15a may be composed of any electrically conductive material. "Electrically conductive" as used through the present disclosure means a material typically having a room temperature conductivity of greater than $10^{-8}$ $(\Omega\text{-m})^{-1}$. Examples of materials that are suitable for the interconnect 15a include metals and doped semiconductors. For example, in one embodiment, the interconnect 15a may be composed of tungsten (W). Other metals that are suitable for the interconnect 15a include, but are not limited to, copper (Cu), titanium (Ti), tantalum (Ta), nickel (Ni), cobalt (Co), silver (Ag), aluminum (Al), platinum (Pt), gold (Au) and alloys thereof.

In one embodiment, electrical contact between the interconnect 15a and the doped region 6 of the semiconductor substrate 5a is provided by a metal semiconductor alloy contact 20a. Electrical contact means that the interconnect 15a and the doped region 6 of the semiconductor substrate 5a are in electrical communication through the interfacing metal semiconductor alloy contact 20a, wherein the interface between metal semiconductor alloy contact 20a and each of the interconnect 15a and the doped region 6 is electrically conductive with low resistance.

In one embodiment, the metal semiconductor alloy contact 20a extends into the dopant region 6 of the semiconductor substrate 5a. The metal semiconductor alloy contact 20a may have a perimeter defined by a convex curvature R1 relative to a centerline C1 of the via opening 14a at the interface I of the interconnect 15a and the upper surface of the semiconductor substrate 5a. The term "convex" as used herein to define the curvature of the line corresponding to the perimeter of the metal semiconductor alloy contact 20a means that the perimeter of the metal semiconductor alloy contact 20a is curving out when viewed from the point of reference P1 that is the interface of the interconnect 15a and the upper surface of the semiconductor substrate 5a at the centerline c1 of the via opening 14a.

In one embodiments, the endpoints E1, E2 for the convex curvature R1 that define the metal semiconductor alloy contact 20a are aligned to an interface I1 between a sidewall S2 of the via opening 14a, a sidewall S1 of the interconnect 15a and an upper surface of the semiconductor substrate 5a. By aligned to it is meant that the endpoints of the E1, E2 for the convex curvature R1 are in direct contact with the interface I1 at the sidewall S2 of the via opening 14a, the sidewall S1 of the interconnect 15a and the upper surface of the semiconductor substrate 5a. In some embodiments, the geometry of the metal semiconductor alloy contact 20a may be referred to as having a mushroom shape. It is further noted that in some embodiments, the curvature $R_1$ of the perimeter of the metal semiconductor alloy contact 20a is non-uniform. By "non-uniform" it is meant that the radius of the curvature $R_1$ is not constant and may vary, resulting in an oblong geometry, as opposed to a circular geometry.

In one embodiment, at least a portion of the metal semiconductor alloy contact 20a extends from the interface I1 between the via opening 14a and the upper surface of the semiconductor substrate 5a under the dielectric layer 10a. In one embodiment, the metal semiconductor alloy contact 20a extends under the dielectric layer 10a by a dimension W2 ranging from 5 nm to 30 nm. In another embodiment, the metal semiconductor alloy contact 20a extends under the dielectric layer 10a by a dimension W2 ranging from 10 nm to 20 nm.

The metal semiconductor alloy contact 20a may be composed of a silicide or germicide. In one example, the metal semiconductor alloy contact 20a may be composed of nickel silicide (NiSi). Other examples of compositions for the metal semiconductor alloy contact 20a may include, nickel platinum silicide (NiPt$_y$Si$_x$), cobalt silicide (CoSi$_x$), tantalum silicide (TaSi$_x$), titanium silicide (TiSi$_x$) and combinations thereof.

Figure 2:
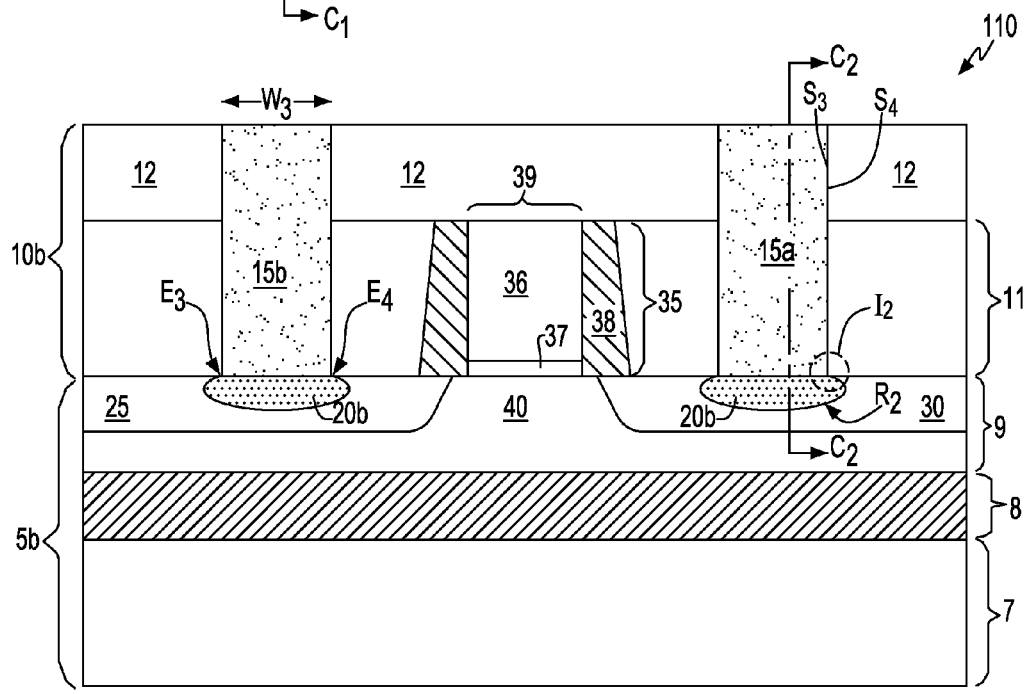
FIG. 2 is a side cross-sectional view of one embodiment of a semiconductor device that includes metal semiconductor alloy contacts that have a convex curvature that extends into the source region and the drain region of the semiconductor device, in which the endpoints for the convex curvature that define the metal semiconductor alloy contacts are aligned to an interface between a sidewall of the interconnect and an upper surface of the semiconductor substrate, in accordance with the present disclosure.

FIG. 2 depicts one embodiment of a semiconductor device 110 that includes metal semiconductor alloy contacts 20b that have a convex curvature R$_2$ that extends into the source region 25 and drain region 30 of the semiconductor device 110. The semiconductor device 110 may be a field effect transistor (FET). A field effect transistor (FET) is a semiconductor device in which output current, i.e., source-drain current, is controlled by the voltage applied to a gate structure. A field effect transistor (FET) has three terminals, i.e., a gate structure 35, a source region 25 and a drain region 30. The gate structure 35 is a structure used to control output current, i.e., flow of carriers in the channel 40, of a semiconducting device 110, such as a field effect transistor, through electrical or magnetic fields. The channel 40 is the region between the source region 25 and the drain region 30 of a field effect transistor (FET) that becomes conductive when the semiconductor device 110 is turned on. The source region 25, is a doped region in the transistor, in which majority carriers are flowing into the channel portion 40. The drain region 30 is the doped region in transistor located at the end of the channel portion 40, in which carriers are flowing out of the semiconductor device through the drain region 30. Although the semiconductor device 110 that is depicted in FIG. 2 is a field effect transistor (FET), the metal semiconductor alloy contacts 20b of the present disclosure are suitable for any semiconductor device including complementary metal oxide semiconductor (CMOS) devices, bipolar junction transistor (BJT) semiconductor devices, schottky barrier semiconductor devices, and finFET semiconductor devices.

In the embodiment depicted in FIG. 2, the semiconductor device 110 is formed on a semiconductor on insulator (SOI) substrate 5b that includes at least an upper semiconductor layer 9 overlying a buried dielectric layer 8. A base semiconductor layer 7 may be present underlying the buried dielectric layer 8.

The upper semiconductor layer 9 may include any semiconducting material including, but not limited to, Si, strained Si, SiC, SiGe, SiGeC, Si alloys, Ge, Ge alloys, GaAs, InAs, and InP, or any combination thereof. In one embodiment, the upper semiconductor layer 9 has a thickness ranging from 1.0 nm to 10.0 nm. In another embodiment, the upper layer 9 has a thickness ranging from 1.0 nm to 5.0 nm. In a further embodiment, the upper semiconductor layer 9 has a thickness ranging from 3.0 nm to 8.0 nm. The base semiconductor layer 7 may be a semiconducting material including, but not limited to; Si, strained Si, SiC, SiGe, SiGeC, Si alloys, Ge, Ge alloys, GaAs, InAs, InP as well as other III/V and II/VI compound semiconductors. The dielectric layer 8 that is present underlying the upper semiconductor layer 9 and atop the base semiconductor layer 7 may be formed by implanting a high-energy dopant into the substrate and then annealing the structure to form a buried oxide layer, i.e., buried dielectric layer. In another embodiment, the dielectric layer 8 may be deposited or grown prior to the formation of the upper semiconductor layer 9. In yet another embodiment, the semiconductor on insulator (SOI) substrate 5b may be formed using wafer-bonding techniques, where a bonded wafer pair is formed utilizing glue, adhesive polymer, or direct bonding. Although not depicted in FIG. 2, the semiconductor device 110 may also be formed on a bulk semiconductor substrate that is similar to the semiconductor substrate 5a that is depicted in FIG. 1.

Referring to FIG. 2, the gate structure 35 may include at least a gate conductor 36 atop a gate dielectric 37. The gate conductor 36 may be a metal gate electrode. In one example, the gate conductor 36 is composed of TiN, TaN, Al or a combination thereof. The metal gate conductor 36 may be composed of any conductive metal including, but not limited to, W, Ni, Ti, Mo, Ta, Cu, Pt, Ag, Au, Ru, Ir, Rh, and Re, and alloys that include at least one of the aforementioned conductive elemental metals. In another embodiment, the gate conductor 36 may also be composed of a doped semiconductor material, such as n-type doped polysilicon.

Although not depicted in FIG. 2, the gate conductor 36 may be a multi-layered structure. For example, the gate conductor 36 may include a second conductive material atop a metal gate electrode. In one example, the second conductive material may be a doped semiconductor material, such as a doped silicon containing material, e.g., n-type doped polysilicon. When a combination of conductive elements is employed, an optional diffusion barrier material such as TaN or WN may be formed between the conductive materials.

The gate conductor 36 of the gate structure 35 is typically present on a gate dielectric 37. The gate dielectric 37 may be a dielectric material, such as SiO$_2$, or alternatively a high-k dielectric, such as oxides of Hf, Ta, Zr, Al or combinations thereof. In another embodiment, the gate dielectric 37 is comprised of an oxide, such as ZrO$_2$, Ta$_2$O$_5$ or Al$_2$O$_3$. In one embodiment, the gate dielectric 37 has a thickness ranging from 1 nm to 10 nm. In another embodiment, the gate dielectric 37 has a thickness ranging from 1.0 nm to 2.0 nm.

A spacer 38 may be in direct contact with the sidewalls of the gate structure 35. The spacer 38 typically has a width ranging from 2.0 nm to 15.0 nm, as measured from the sidewall of the gate structure 35. The spacer 38 may be composed of a dielectric, such as a nitride, oxide, oxynitride, or a combination thereof. In one example, the spacer 38 is composed of silicon nitride (Si$_3$N$_y$).

The gate dielectric 37 and the gate conductor 36 of the gate structure 35 are present over the channel portion of the semiconductor on insulator (SOI) substrate 5b. Source region 25 and drain region 30 may be on opposing sides of the channel portion 40. The conductivity-type of the source region 25 and the drain region 30 determines the conductivity of the semiconductor device 110. Conductivity-type denotes whether the source region 25 and the drain region 30 have been doped with a p-type or n-type dopant. N-type dopant in a silicon containing material layer includes type V elements from the Periodic Table of Elements, such as phosphorus and arsenic. P-type dopant in a silicon containing material layer includes type III elements from the Periodic Table of Elements, such as boron.

Each of the source region 25 and the drain region 30 may include an extension dopant region and a deep dopant region (not shown). Typically, the dopant concentration of the extension dopant region having p-type dopant ranges from $5 \times 10^{19}$ atoms/cm$^3$ to $5 \times 10^{20}$ atoms/cm$^3$. In another embodiment, the extension dopant region having p-type dopant ranges from $7 \times 10^{19}$ atoms/cm$^3$ to $2 \times 10^{20}$ atoms/cm$^3$. Typically, the dopant concentration of the extension dopant region having n-type conductivity ranges from $5 \times 10^{19}$ atoms/cm$^3$ to $5 \times 10^{20}$ atoms/cm$^3$. In another embodiment, the extension dopant region having n-type conductivity ranges from $7 \times 10^{19}$ atoms/ cm³ to 2×10²⁰ atoms/cm³. The deep dopant regions typically have the same conductivity dopant that may be present in greater concentration at greater depths into the upper semiconductor layer 9 of the semiconductor on insulator (SOI) substrate 5b than the extension dopant region.

At least one dielectric layer 10b may be present over the semiconductor device 110. In the embodiment that is depicted in FIG. 2, an interlevel dielectric layer 11 is present on the upper surface of the semiconductor on insulator (SOI) substrate 5b. The interlevel dielectric layer 11 may have a composition that is equal to the composition of the dielectric layer 10a that is described above with reference to FIG. 1. In one example, the interlevel dielectric layer 11 may be composed of silicon nitride. The upper surface of the interlevel dielectric layer 11 may be coplanar with the upper surface of the gate structure 35. The interlevel dielectric layer 11 may have a thickness ranging from 5 nm to 40 nm. In another embodiment, the interlevel dielectric layer 11 has a thickness ranging from 10 nm to 20 nm.

In one embodiment, a planarization stop layer 12 may be present on an upper surface of the interlevel dielectric layer 11 and on an upper surface of the gate structure 35. The planarization stop layer 12 may have a thickness ranging from 5 nm to 40 nm. In another embodiment, the planarization stop layer 12 has a thickness ranging from 10 nm to 20 nm. The planarization stop layer 12 is a nitride or oxynitride material. In one example, the planarization stop later 12 is composed of silicon nitride ($Si_3N_y$).

Referring to FIG. 2, a via opening 14b may be present through the interlevel dielectric layer and the planarization layer 12 to each of the source region 25 and the drain region 30. The via opening 14b may have a width W3 ranging from 15 nm to 60 nm. In another embodiment, the via opening 14b may have a width W3 ranging from 30 nm to 40 nm. In one example, the via opening 14b exposes the upper surfaces of the semiconductor on insulator (SOI) substrate 5b in which the source region 25 and the drain region 30 are present. The interconnect 15b that is contained within the via opening 14b is similar to the interconnect 15a that is described above with reference to FIG. 1. Therefore, the above-description of the interconnect 15a to the doped region 6 that is depicted in FIG. 1 is suitable for the interconnect 15b to the source region 25 and drain region 30 that is depicted in FIG. 2.

In one embodiment, electrical contact between the interconnect 15b, the source region 25 and the drain region 30 is provided by a metal semiconductor alloy contact 20b. The composition of the metal semiconductor alloy contact 20b that is depicted in FIG. 2 is similar to the metal semiconductor alloy contact 20a that is depicted in FIG. 1. Therefore, the above-description of the metal semiconductor alloy contact 20a that is depicted in FIG. 1 is suitable for the metal semiconductor alloy contact 20b that is depicted in FIG. 2.

In one embodiment, the metal semiconductor alloy contact 20b extends into the source region 25 and the drain region 30 of the semiconductor on insulator (SOI) substrate 5b. Similar to the metal semiconductor alloy contact 20a that is depicted in FIG. 1, the metal semiconductor alloy contact 20b that is depicted in FIG. 2 includes a perimeter defined by a convex curvature R2 relative to a centerline C2 of the via opening 14b at the interface of the interconnect 15b and the upper surface of the semiconductor on insulator (SOI) substrate 5b. Similar to the metal semiconductor alloy contact 20a that is depicted in FIG. 1, the endpoints E3, E4 for the convex curvature R2 that define the metal semiconductor alloy contact 20b that is depicted in FIG. 2 are aligned to an interface I2 between a sidewall S3 of the via opening 14b, a sidewall S4 of the interconnect 15b and an upper surface of the semiconductor on insulator (SOI) substrate 5b. In some embodiments, the geometry of the metal semiconductor alloy contact 20b may be referred to as having a mushroom shape. It is further noted that in some embodiments, the curvature $R_2$ of the perimeter of the metal semiconductor alloy contact 20b is non-uniform.

In one embodiment, at least a portion of the metal semiconductor alloy contact 20b extends from the interface I2 between the via opening 14b and the upper surface of the semiconductor on insulator (SOI) substrate 5b under the interlevel dielectric layer 11. In one embodiment, the metal semiconductor alloy contact 20b extends under the interlevel dielectric layer 11 by a dimension ranging from 5 nm to 30 nm. In another embodiment, the metal semiconductor alloy contact extends under the interlevel electric layer 11 by a dimension ranging from 10 nm to 20 nm.

In comparison to metal semiconductor alloy contacts that do not extend beyond the sidewall of the trench containing the metal semiconductor alloy contacts, the metal semiconductor alloy contacts 20b having a convex curvature R2 that extends under the interlevel dielectric 11 reduces the distance that the metal semiconductor alloy contact is separated from channel portion 40 of the semiconductor device 40. In one embodiment, by reducing the distance that the metal semiconductor alloy contacts 20b is separated from the channel portion 40, the metal semiconductor alloy contacts 20b having the convex curvature $R_2$ provides a 15% reduction in serial resistance, when compared to metal semiconductor alloy contacts that are contained within a trench and do not include a portion that extends beneath the intralevel dielectric layer.

Although only one semiconductor device 110 is depicted in FIG. 2, any number of semiconductor devices 110 may be formed on the semiconductor on insulator (SOI) substrate 5b. The spacing the gate structures 35 of adjacent semiconductor devices dictates the pitch. The term "pitch" means the center-to-center distance between two repeating elements of a circuit including semiconductor devices. In one embodiment, the pitch may be measured from the center of the upper surface of a first replacement gate structure to the center of the upper surface of an adjacent replacement gate structure. The actual dimensions for the pitch may depend upon the technology node. In one example, the gate pitch is selected to correspond to the 20 nm technology node. In one example, the pitch ranges from 80 nm to 100 nm.

Figure 3:
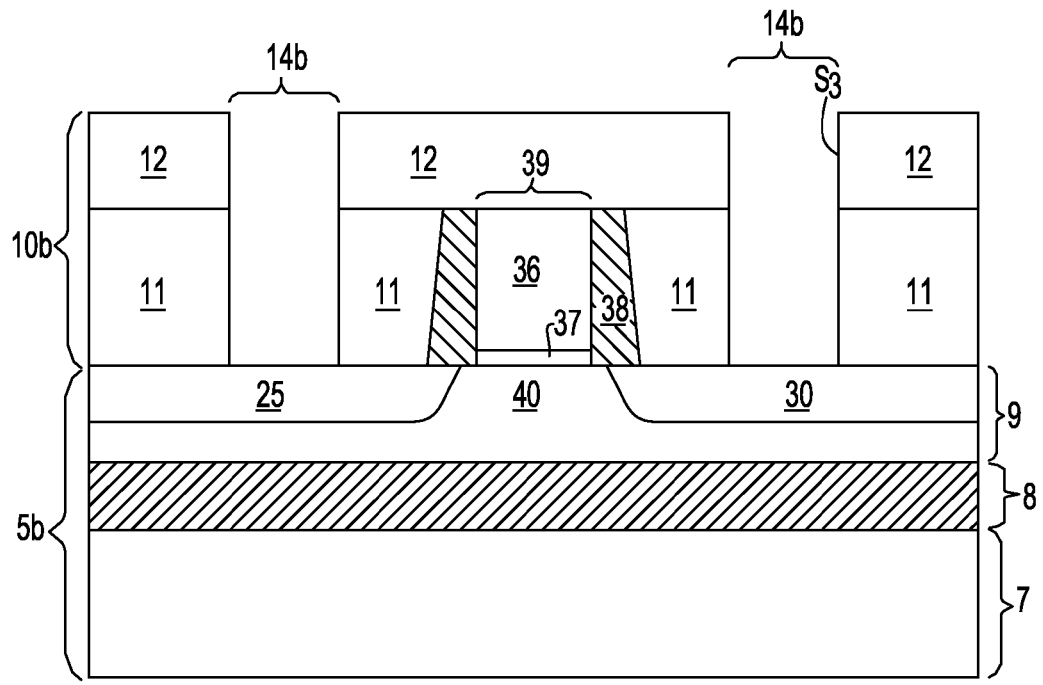
FIG. 3 is a side cross-sectional view of one embodiment of an initial structure used in a method to provide the metal semiconductor alloy contacts depicted in FIGS. 1 and 2, wherein the initial structure includes a semiconductor device that is formed on a semiconductor substrate and a dielectric layer is present over the semiconductor device having via openings to the source region and the drain region of the semiconductor device, in accordance with the present disclosure.

One embodiment of forming the structure depicted in FIG. 2 is now described with reference to FIGS. 3-8. FIG. 3 depicts one embodiment of an initial structure used in a method to provide the metal semiconductor alloy contacts 20b that are depicted in FIG. 2. The initial structure may include a semiconductor on insulator substrate 5b, a gate structure 35, source region 25, drain region 30, and a dielectric layer 10b, wherein a via opening 14b is present through the dielectric layer 10b to each of the source region 25 and the drain region 30. The gate structure 35 that is depicted in FIG. 3 may be formed using replacement gate technology. In replacement gate technology, a sacrificial material dictates the geometry and location of the later formed gate structure 35. The sacrificial material is used to form the doped regions of the semiconductor on insulator (SOI) substrate 5b such as the source region 25 and the drain region 30. The sacrificial material is then replaced with the gate structure 35. By employing a sacrificial material, the thermal budget that is applied to the gate structure 35 may be reduced.

In one embodiment, a method sequence for forming the structure depicted in FIG. 3 begins with forming a sacrificial gate structure (not shown), i.e., a sacrificial material having the geometry of the subsequently formed gate structure 35, on a semiconductor on insulator (SOI) substrate 5b. The semiconductor on insulator (SOI) substrate 5b has been described above with reference to FIG. 2. The sacrificial gate structure may be composed of any material that can be etched selectively to the underlying upper semiconductor layer 9 of the semiconductor on insulator (SOI) substrate 5b. In one embodiment, the sacrificial gate structure may be composed of a silicon-containing material, such as polysilicon. Although the sacrificial gate structure is typically composed of a semiconductor material, the sacrificial gate structure may also be composed of a dielectric material, such as an oxide, nitride or oxynitride material, or amorphous carbon.

The sacrificial material may be patterned and etched to provide the sacrificial gate structure. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected, while the exposed regions are removed using a selective etching process that removes the unprotected regions. As used herein, the term "selective" in reference to a material removal process denotes that the rate of material removal for a first material is greater than the rate of removal for at least another material of the structure to which the material removal process is being applied.

In one embodiment, the etch process removes the exposed portions of the sacrificial material layer with an etch chemistry that is selective to the substrate 10. In one another embodiment, the etch process that forms the sacrificial gate structure is an anisotropic etch. An anisotropic etch process is a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation.

The spacer 38 is then formed adjacent to the sacrificial gate structure, i.e., in direct contact with the sidewall of the sacrificial gate structure. The composition and dimensions of the spacer 38 have been described above with reference to FIG. 2. In one embodiment, the spacer 38 may be formed by using a blanket layer deposition, such as chemical vapor deposition, and anisotropic etchback method.

The source region 25 and the drain region 30 may then be formed in portions of the semiconductor on insulator (SOI) substrate 5b on opposing sides of the portion of the semiconductor on insulator (SOI) substrate 5b that the sacrificial gate structure is present on. In one embodiment, the source region 25 and the drain region 30 are formed using an ion implantation process. More specifically, when forming a p-type extension region portion of the source region 25 and drain region 30 a typical dopant species is boron or $BF_2$. Boron may be implanted utilizing implant energies ranging from 0.2 keV to 3.0 keV with an implant dose ranging from $5\times10^{14}$ atoms/cm² to $5\times10^{15}$ atoms/cm². $BF_2$ may be implanted utilizing implant energies ranging from 1.0 keV to 15.0 keV and a dose ranging from $5\times10^{14}$ atoms/cm² to $5\times10^{15}$ atoms/cm². A typical implant for the n-type extension dopant region of the source region 25 and the drain region 30 is arsenic. The n-type extension dopant region of the source region 25 and the drain region 30 can be implanted with arsenic using implant energies ranging from 1.0 keV to 10.0 keV with a dose ranging from $5\times10^{14}$ atoms/cm² to $5\times10^{15}$ atoms/cm². The deep dopant region of the source region 25 and the drain region 30 may have the same conductivity as the extension dopant region, but may be implanted with a higher dose and implant energy. The source region 25 and drain region 30 may further include halo implant regions. Halo implant regions typically have the opposite conductivity as the extension dopant region and may be formed using an angled ion implantation.

Referring to FIG. 3, the interlevel dielectric layer 11 is deposited atop the semiconductor device 110 and the semiconductor on insulator (SOI) substrate 5. The composition of the interlevel dielectric layer 11 has been described above with reference to FIG. 2. The interlevel dielectric layer 11 may be deposited using chemical vapor deposition (CVD). Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes include but are not limited to Atmospheric Pressure CVD (APCVD), Low Pressure CVD (LPCVD) and Plasma Enhanced CVD (EPCVD), Metal-Organic CVD (MOCVD) and others. In addition to chemical vapor deposition (CVD), the interlevel dielectric layer 11 may also be formed using spinning from solution, spraying from solution, and evaporation.

Following deposition, the interlevel dielectric layer 11 is planarized until the upper surface of the sacrificial gate structure is exposed. "Planarization" is a material removal process that employs at least mechanical forces, such as frictional media, to produce a planar surface. In one embodiment, the planarization process includes chemical mechanical polishing (CMP) or grinding. Chemical mechanical planarization (CMP) is a material removal process using both chemical reactions and mechanical forces to remove material and planarize a surface.

The sacrificial gate structure is removed to provide an opening 39 to an exposed portion of the semiconductor on insulator (SOI) substrate 5b. The sacrificial gate structure is typically removed using a selective etch process that removes the sacrificial gate structure selective to the semiconductor on insulator (SOI) substrate 5b, the spacer 38 and the intralevel dielectric 11. The etch may be an isotropic etch or an anisotropic etch. The anisotropic etch may include reactive-ion etching (RIE). Other examples of anisotropic etching that can be used at this point of the present disclosure include ion beam etching, plasma etching or laser ablation. In comparison to anisotropic etching, isotropic etching is non-directional. One example of an isotropic etch is a wet chemical etch. In one embodiment, in which the sacrificial gate structure is composed of polysilicon, the upper semiconductor layer 9 of the semiconductor on insulator substrate 5b is a silicon-containing material, and the spacer 38 is composed of nitride ($Si_3N_4$), the wet etch chemistry for removing the sacrificial gate structure may be composed of DHF and hot $NH_3$, or TetraMethyl Ammonium Hydroxide (TMAH).

A functional gate structure 35 is formed in the opening 39 in the interlevel dielectric layer 11 to the semiconductor on insulator (SOI) substrate 5b. In one embodiment, a gate dielectric 37 is formed on the exposed upper surface of the upper semiconductor layer 9 of the semiconductor on insulator (SOI) substrate 5b. The gate dielectric 37 may be composed of a high-k dielectric material. The term "high-k" denotes a material having a dielectric constant that is greater than the dielectric constant of silicon oxide ($SiO_2$) at room temperature, i.e., 20° C. to 25° C. In one embodiment, the high-k dielectric that provides the gate dielectric 37 is comprised of a material having a dielectric constant that is greater than 4.0, e.g., 4.1. In another embodiment, the high-k gate dielectric that provides the gate dielectric layer 37 is comprised of a material having a dielectric constant greater than 7.0. In yet another embodiment, the high-k gate dielectric that provides the gate dielectric layer 37 is comprised of a material having a dielectric constant ranging from greater than 4.0 to 30. The dielectric constants mentioned herein are relative to a vacuum at room temperature, i.e., 20° C. to 25° C.

In one example, a high-k gate dielectric 37 is provided by hafnium oxide (HfO$_2$). Other examples of suitable high-k dielectric materials for the gate dielectric 37 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof.

In one embodiment, the gate dielectric 37 is formed using a deposition process, such as chemical vapor deposition (CVD). In another embodiment, the gate dielectric 37 may be formed by a thermal growth process such as, for example, oxidation, nitridation or oxynitridation. The gate dielectric 37 may have a thickness ranging from 1 nm to 5 nm. In another embodiment, the gate dielectric 37 has a thickness ranging from 1 nm to 2.5 nm. In yet another example, the gate dielectric 37 has a thickness that ranges from 15 Å to 20 Å.

A gate conductor 36 is formed on the gate dielectric 37 filling the opening 39. In one embodiment, the gate conductor 36 is composed of a metal, such as a work function metal layer. In one embodiment, in which the semiconductor device 110 is an n-type semiconductor device, the work function metal layer that provides the gate conductor 36 is an n-type work function metal layer. As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV.

In one embodiment, the n-type work function metal layer is composed of at least one of TiAl, TaN, TiN, HfN, HfSi, or combinations thereof. The n-type work function metal layer can be deposited using chemical vapor deposition (CVD), atomic layer deposition (ALD), sputtering or plating. In one embodiment, the n-type work function metal layer is composed of titanium aluminum (TiAl) and is deposited using sputtering. As used herein, "sputtering" means a method for depositing a film of metallic material, in which a target of the desired material, i.e., source, is bombarded with particles, e.g., ions, which knock atoms from the target, where the dislodged target material deposits on a deposition surface. Examples of sputtering apparatus that may be suitable for depositing the n-type work function metal layer include DC diode type systems, radio frequency (RF) sputtering, magnetron sputtering, and ionized metal plasma (IMP) sputtering. In one example, an n-type work function metal layer composed of TiN is sputtered from a solid titanium target, in which the nitrogen content of the metal nitride layer is introduced by a nitrogen gas. In another example, an n-type work function metal layer composed of TiN is sputtered from a solid target comprised of titanium and nitrogen. In addition to physical vapor deposition (PVD) techniques, the n-type work function metal layer may also be formed using chemical vapor deposition (CVD) and atomic layer deposition (ALD).

In another embodiment, the work function metal layer may be a p-type work function metal layer. As used herein, a "p-type work function metal layer" is a metal layer that effectuates a p-type threshold voltage shift. In one embodiment, the work function of the p-type work function metal layer 24 ranges from 4.9 eV to 5.2 eV. As used herein, "threshold voltage" is the lowest attainable gate voltage that will turn on a semiconductor device 110, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero.

In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof. In one embodiment, the p-type work function metal layer comprising titanium nitride (TiN) may be deposited by a physical vapor deposition (PVD) method, such as sputtering. Examples of sputtering apparatus that may be suitable for depositing the p-type work function metal layer include DC diode type systems, radio frequency (RF) sputtering, magnetron sputtering, and ionized metal plasma (IMP) sputtering. In addition to physical vapor deposition (PVD) techniques, the p-type work function metal layer may also be formed using chemical vapor deposition (CVD) and atomic layer deposition (ALD).

In another embodiment, the gate conductor 36 is provided by a doped semiconductor, such as n-type doped polysilicon. In one embodiment, the gate conductor 36 is planarized until the upper surface of the gate conductor 36 is coplanar with the upper surface of the interlevel dielectric 11, as depicted in FIG. 3. In some examples, the gate conductor 36 may be planarized using chemical mechanical planarization (CMP).

A planarization stop layer 12 may be formed atop the upper surface of the interlevel dielectric layer 11 and the gate conductor 36. In one example, the planarization layer 12 is composed of silicon nitride (Si$_3$N$_4$). The planarization layer 12 may be deposited using chemical vapor deposition (CVD). Variations of CVD processes include but are not limited to Atmospheric Pressure CVD (APCVD), Low Pressure CVD (LPCVD) and Plasma Enhanced CVD (EPCVD), Metal-Organic CVD (MOCVD) and others. In addition to chemical vapor deposition (CVD), the planarization layer 12 may also be formed using spinning from solution, spraying from solution, and evaporation.

Via openings 14b may be formed through the planarization layer 12 and the interlevel dielectric layer 11 to expose an upper surface of the upper semiconductor layer 9 in which the source region 25 and the drain region 30 are present. The via openings 14b may be formed using photolithography and etch processes. For example, a photoresist etch mask can be produced by applying a photoresist layer to the upper surface of the planarization stop layer 12, exposing the photoresist layer to a pattern of radiation, and then developing the pattern into the photoresist layer utilizing a resist developer. The photoresist etch mask may be positioned so that portions of the planarization stop layer 12 and the interlevel dielectric layer 11 are not protected by the photoresist etch mask in order to provide the via openings 14b.

The exposed portion of the planarization stop layer 12 and the interlevel dielectric layer 11 is then removed by a selective etch. The selective etch may be an anisotropic etch or an isotropic etch. In one embodiment, the via holes 14b are first formed in the planarization stop layer 12 with an etch that terminates on the interlevel dielectric 11. Thereafter, the via holes 14b are then extended through the interlevel dielectric layer 11 to the source region 25 and the drain region 30. In one example, when the planarization stop layer 12 is composed of silicon oxide or silicon nitride, and the upper semiconductor layer 9 of the semiconductor on insulator (SOI) substrate 5 is composed of silicon, the etch chemistry for forming the via holes 14b to the source region 25 and drain region 30 is composed of fluorine based chemical, such as $CF_4$, $CClF_2$, $SF_6$ and combinations thereof. The width W3 of the via opening 14b is described above with reference to FIG. 2.

Figure 4:
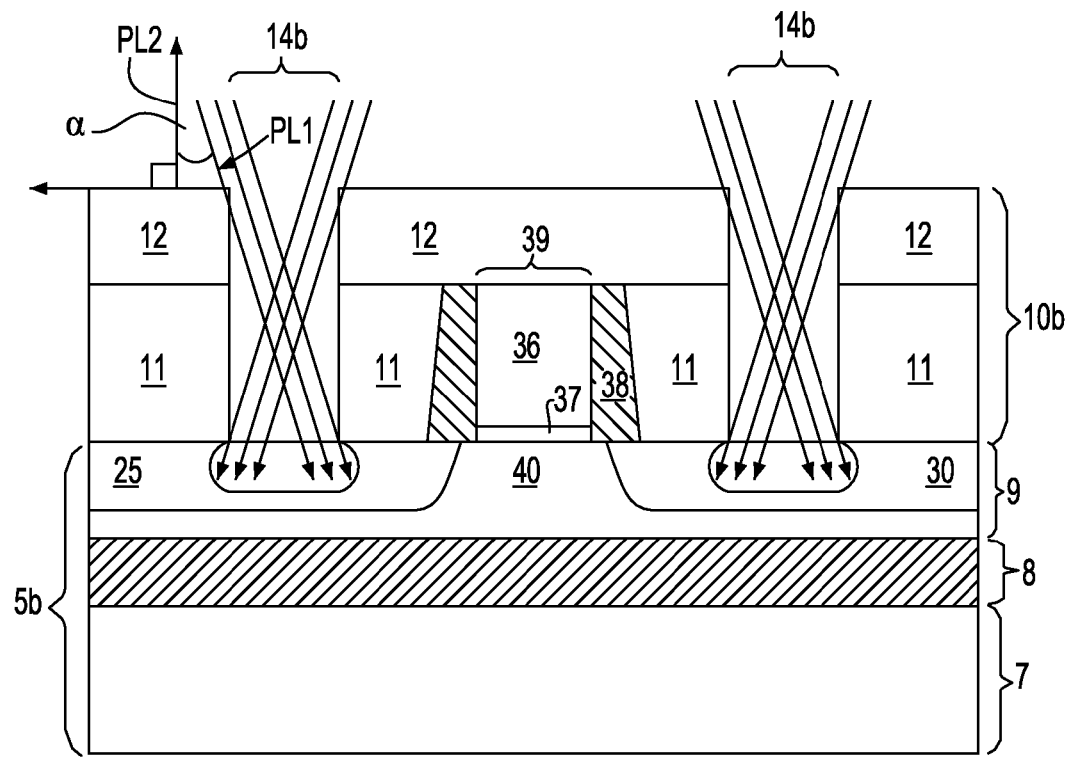
FIG. 4 is a side cross-sectional view of forming an amorphous region in the semiconductor substrate by an angled ion implantation through the via opening into the exposed surface of the semiconductor substrate, in accordance with one embodiment of the present disclosure.

FIG. 4 depicts forming an amorphous region 19 in the upper semiconductor layer 9 of the semiconductor on insulator (SOI) substrate 5b. As used herein, the term "amorphous" denotes a non-crystalline solid. The amorphous region 19 may be composed of amorphous silicon. As used herein, the term "amorphous Si" (α-Si) denotes a non-crystalline form of silicon. The amorphous region 19 may have a geometry similar to the subsequently formed metal semiconductor alloy contact. In one embodiment, the amorphous region 19 has a perimeter defined by a convex curvature. At least a portion of the amorphous region 19 extends under the interlevel dielectric layer 11 at each sidewall S3 of the via opening 14b.

In one embodiment, the amorphous region 19 may be formed by angled ion implantation 16 through the via opening 14b into the exposed upper surface of the upper semiconductor layer 9 of the semiconductor on insulator (SOI) substrate 5b. In one embodiment, the remaining portion of the upper semiconductor layer 9 that is noted doped by the angled ion implantation 16 is crystalline, such as single crystal silicon and polysilicon.

Angled ion implantation 16 as used throughout the instant application denotes that dopants are implanted towards the exposed surface of the upper semiconductor layer 9 along a plane PL1 that forms an acute angle α when intersecting with the plane PL1 that is substantially perpendicular to the upper surface of the semiconductor-containing layer 6. The angled ion implantation 9 may include an angle α ranging from 3° to 75°. In another embodiment, the angled ion implantation 9 includes an angle α ranging from 5° to 60°. In an even further embodiment, the angled ion implantation 9 includes an angle α ranging from 15° to 45°. It is noted that other angles are suitable for the angled ion implantation 16, so long as at least a portion of the dopant is introduced to a portion of the upper semiconductor layer 9 that extends under the interlevel dielectric layer 11.

The dopant composition, implant dose, and implant energy are selected to disrupt the crystalline state of the upper semiconductor layer 9 so that it is amorphous. In one example, prior to the angled ion implantation 16, the upper semiconductor layer 9 is crystalline, such as single crystal silicon or polysilicon, wherein after the angled ion implantation 16 the implanted portions of the upper semiconductor layer 9 are amorphous. The dopant composition may be an n-type dopant, such as arsenic and phosphorus, p-type dopant, such as $BF_2$ or aluminum, or a neutral conductivity type dopant. In one embodiment, the dopants are composed of carbon, arsenic, boron, phosphorus, germanium, xenon, argon, krypton, or a combination thereof. It is noted that other dopants are also contemplated and are within the scope of the invention, so long as the dopants convert the implanted portion of the upper semiconductor layer 9 from a crystalline material to a material having an amorphous crystal structure.

In one example, the angled implant 16 may include a boron dopant and may employ an implant having an ion dosage ranging from $1\times10^{13}$ atoms/cm$^2$ to $5\times10^{15}$ atoms/cm$^2$. In one embodiment, the angled implant 16 is carried out using an ion implant apparatus that operates at an energy ranging from 5.0 keV to 60.0 keV. In another embodiment, the angled implant 16 is carried out using an energy of from 10.0 keV to 40.0 keV. The angled implant 16 may be carried out at a temperature ranging from 50° C. to 800° C. In another embodiment, the angled implant 16 is carried out with a temperature ranging from 100° C. to 400° C.

The concentration of the dopant in the amorphous region 19 of the upper semiconductor layer 9 may range from $1\times10^{18}$ atoms/cm$^3$ to $8\times10^{21}$ atoms/cm$^3$. In another embodiment, the dopant concentration in the amorphous region 19 of the upper semiconductor layer 9 ranges from $1\times10^{19}$ atoms/cm$^3$ to $3\times10^{20}$ atoms/cm$^3$.

Figure 5:
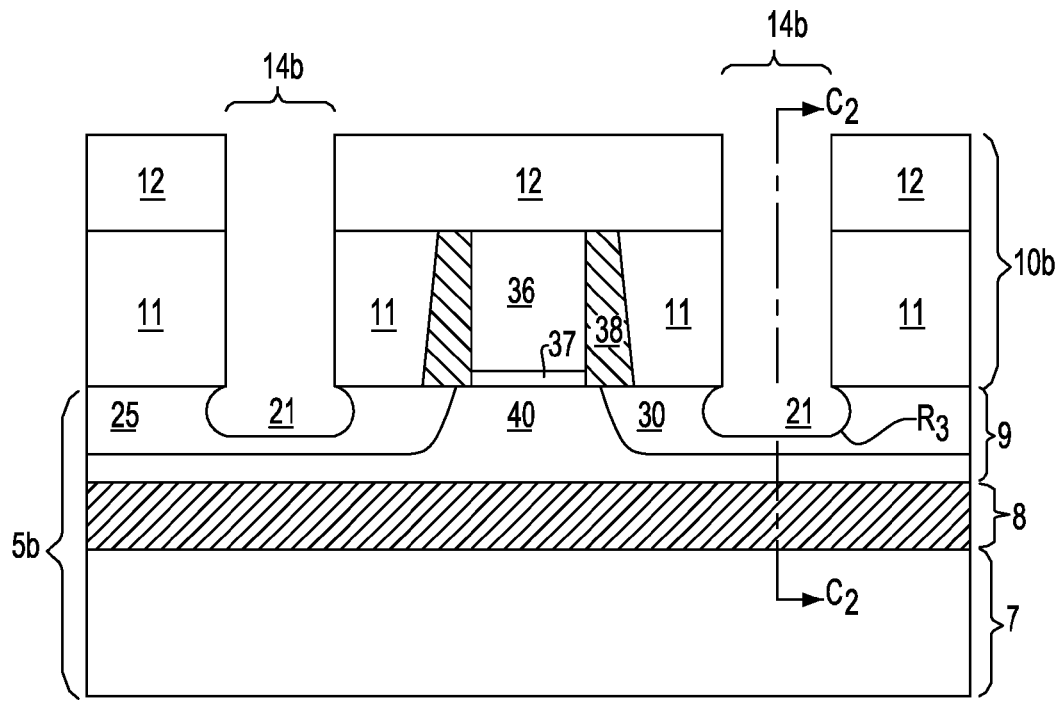
FIG. 5 is a side cross-sectional view of removing the amorphous region from the semiconductor substrate to form a divot having a convex curvature relative to the centerline of the via opening, in accordance with one embodiment of the present disclosure.

FIG. 5 depicts removing the amorphous region 19 to form a divot 21 having a convex curvature R3 relative to the centerline C2 of the via opening 14b. The curvature R3 of the divot 21 may be mushroom shaped. In some embodiments, the curvature of the perimeter of the divot 21 is non-uniform, i.e., the divot 21 has an oblong geometry.

In one embodiment, the amorphous region 19 may be removed using a selective etch process. For example, the amorphous region 19 may be removed by an etch that removes material having an amorphous crystal structure, such as amorphous silicon, selective to material having a crystalline structure, such as single crystal silicon. In one embodiment, the amorphous region 19 may be removed with an etch having a selectivity single crystal silicon of greater than 100:1.

The selective etch may be an isotropic etch. An "isotropic etch" is a etch process that is not a directional etch. An isotropic etch removes the material being etched at the same rate in each direction. Isotropic etch processes are contrary to anisotropic etch processes, which preferentially etch in one direction, such as reactive ion etch (RIE). One example, of an isotropic etch is a wet chemical etch. In one embodiment, in which the amorphous region 19 is composed of amorphous silicon, and the remaining portion of the upper semiconductor layer 9 that has not been doped by the angled ion implantation 16 is composed of single crystal silicon, the amorphous region 19 may be removed by a wet etch having a composition of 126 $HNO_3$:60 $H_2O$: 5 $NH_4F$. In another embodiment, in which the amorphous region 19 is composed of amorphous silicon, and the remaining portion of the upper semiconductor layer 9 that has not been doped by the angled ion implantation 16 is composed of single crystal silicon, the amorphous region 19 may be removed by a wet etch having a potassium hydroxide (KOH) composition. In one embodiment, the etch temperature may range from 20° C. to 80° C.

In one embodiment, the divot 21 that is formed by removing the amorphous region may extend under the interlevel dielectric layer 11 by a dimension ranging from 5 nm to 30 nm, as measured from the sidewall (S2) of the via opening 14b. In another embodiment, the divot 21 that is formed by removing the amorphous region 21 may extend under the interlevel dielectric layer 11 by a dimension ranging from 10 nm to 20 nm, as measured from the sidewall (S2) of the via opening 14b.

Figure 6:
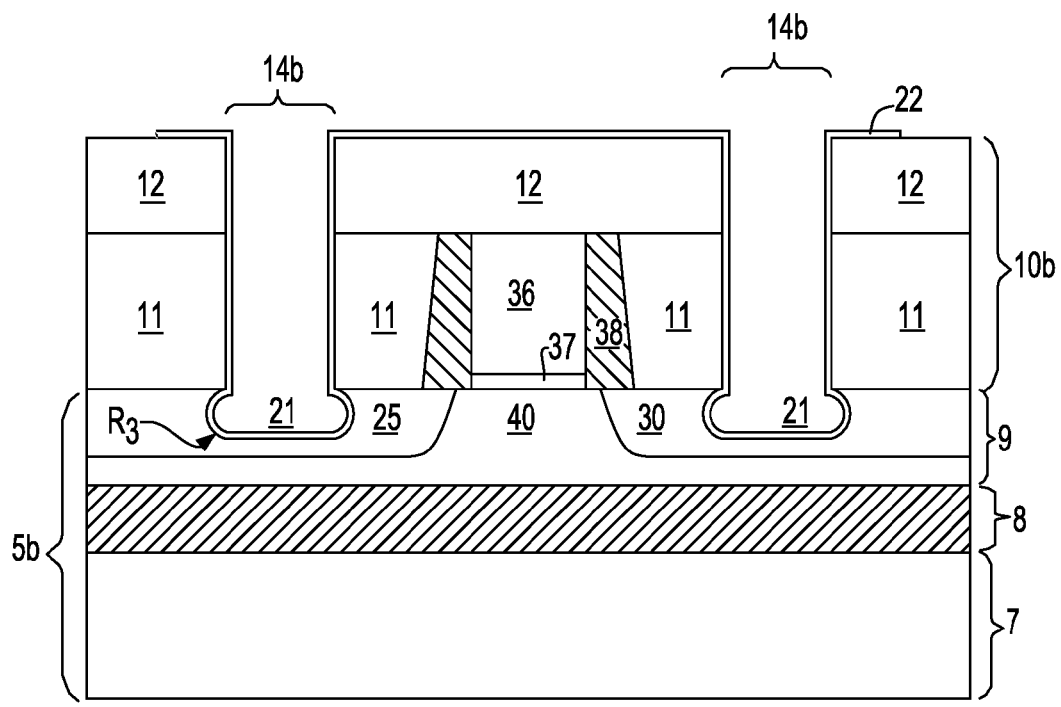
FIG. 6 is a side cross-sectional view of forming a metal-containing material on the divot, in accordance with one embodiment of the present disclosure.

FIG. 6 depicts one embodiment of forming a metal containing material 22 on the divot 21. The metal containing layer 22 may be deposited on the upper surface of the planarization stop layer 12, the sidewalls S2 of the via opening 14b, and the base of the divot 21. In one embodiment, the metal containing material 22 fills the divot 21. The conformal deposited metal containing material 22 may be deposited on the convex curvature $R_3$ of the divot 21 including the portion of the divot 21 that extends under the interlevel dielectric layer 11.

In one embodiment, the metal containing layer 22 is a conformally deposited layer. The term "conformal layer" and "conformally deposited layer" denotes a layer having a thickness that does not deviate from greater than or less than 20% of an average value for the thickness of the layer. The metal containing material 22 may be deposited using physical vapor deposition (PVD) methods or chemical vapor deposition (CVD) methods. Examples of physical vapor deposition (PVD) that are suitable for forming the metal containing material 22 include sputtering and plating. As used herein, "sputtering" means a method of depositing a film of material on a semiconductor surface. A target of the desired material, i.e., source, is bombarded with particles, e.g., ions, which knock atoms from the target, and the dislodged target material deposits on the semiconductor surface. Examples of sputtering apparatuses include DC diode type systems, radio frequency (RF) sputtering, magnetron sputtering, and ionized metal plasma (IMP) sputtering.

In one example, the metal containing material 22 may be composed of nickel or nickel platinum alloy. The metal containing material 22 may also include at least one of nickel (Ni), cobalt, (Co), tungsten (W), titanium (Ti), tantalum (Ta), aluminum (Al), platinum (Pt) and combinations thereof. The metal containing material 22 may have a thickness ranging from 5 nm to 20 nm. In another embodiment, the metal containing material 22 may have a thickness ranging from 6 nm to 15 nm.

Figure 7:
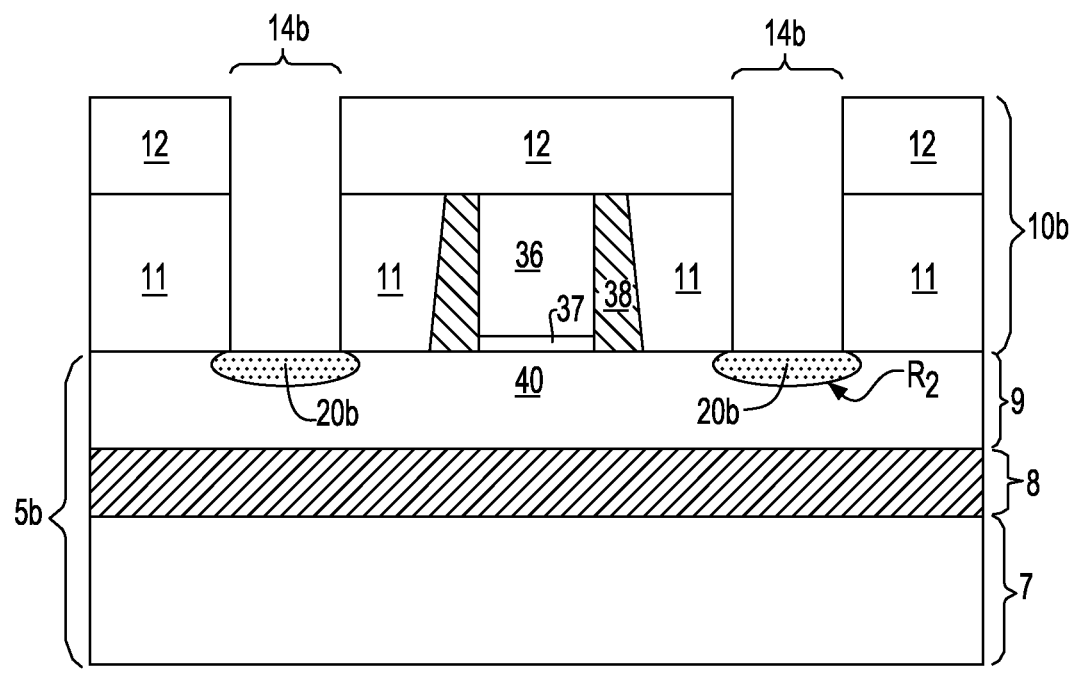
FIG. 7 is a side cross-sectional view of converting the metal-containing material and a portion of the semiconductor substrate adjacent to the divot into a metal semiconductor alloy contact that has a convex curvature that extends into each of the source region and the drain region, in accordance with one embodiment of the present disclosure.

FIG. 7 depicts one embodiment of converting the metal containing material 22 and a portion of the upper semiconductor layer 9 semiconductor on insulator (SOI) substrate 5b that is adjacent to the divot 21 into a metal semiconductor alloy contact 20b that has a convex curvature R2 that extends into the source region 25 and the drain region 30. Following deposition of the metal containing material 22, the structure is subjected to an annealing step including, but not limited to, rapid thermal annealing. During annealing, the deposited metal containing material 22 reacts with the semiconductor material of the upper semiconductor layer 9 forming a metal semiconductor alloy contact 20b, such as a metal silicide. In one embodiment, the thermal anneal is completed at a temperature ranging from 350° C. to 600° C. for a time period ranging from 1 second to 90 seconds. Following thermal anneal, the non-reacted portion of the metal containing layer 22 is removed. The non-reacted portion of the metal containing layer 22 may be removed by an etch process that is selective to the metal semiconductor alloy contact 20b. The composition and the geometry of the metal semiconductor alloy contact 20b has been described above with reference to FIG. 2.

Referring to FIG. 2, an interconnect 15b may be formed in direct contact with the metal semiconductor alloy contact 20b, wherein the interconnect 15b is contained within the via opening 14b. Interconnects 15b are formed by depositing a conductive metal into the via openings 14b using a deposition process, such as physical vapor deposition (PVD). Examples of physical vapor deposition (PVD) that are suitable for forming the interconnect 15b include sputtering and plating. Examples of sputtering apparatuses suitable for forming the interconnect 15b include DC diode type systems, radio frequency (RF) sputtering, magnetron sputtering, and ionized metal plasma (IMP) sputtering. The interconnect 15b may also be formed using chemical vapor deposition. The interconnect 15b may be composed of a conductive metal, such as tungsten, copper, aluminum, silver, gold, and alloys thereof.

While the claimed methods and structures has been particularly shown and described with respect to preferred embodiments thereof, it will be understood by those skilled in the art that the foregoing and other changes in form and details may be made therein without departing from the spirit and scope of the presently claimed methods and structures.

What is claimed is:

1. A method of forming a semiconductor device comprising:
    forming a gate structure on a channel portion of a semiconductor substrate, wherein a source region and a drain region are present on opposing sides of the channel portion of the semiconductor substrate;
    forming a dielectric layer over the gate structure;
    forming a via opening through the dielectric layer to an exposed surface of the semiconductor substrate containing at least one of the source region and the drain region;
    forming an amorphous region in the semiconductor substrate by angled ion implantation through the via opening into the exposed surface of the semiconductor substrate;
    removing the amorphous region to form a divot having a convex curvature relative to the centerline of the via opening;
    forming a metal containing material on the divot; and
    converting the metal containing material and a portion of the semiconductor substrate adjacent to the divot into a metal semiconductor alloy contact that has a convex curvature that extends into the at least one of the source region and the drain region, wherein endpoints for the convex curvature that define the metal semiconductor alloy contact are aligned to an interface between a sidewall of the via opening and an upper surface of the semiconductor substrate; and forming an interconnect within the via opening in direct contact with the metal semiconductor alloy contact.

2. The method of claim 1, wherein the gate structure is formed using a replacement gate process.

3. The method of claim 2, wherein the replacement gate process comprises:
    forming a sacrificial gate material on the channel portion of the semiconductor substrate;
    forming a spacer adjacent to the sacrificial gate material;
    forming the source region and the drain region on opposing sides of the sacrificial gate material;
    removing the sacrificial gate material to provide an opening defined by the spacer to the channel portion of the semiconductor substrate; and
    forming the gate structure in the opening.

4. The method of claim 1, wherein the gate structure includes at least one gate dielectric and at least one gate conductor.

5. The method of claim 1, wherein the metal semiconductor alloy contact comprises a silicide or germide.

6. The method of claim 5, wherein the metal semiconductor alloy contact comprises nickel silicide ($NiSi_x$), nickel platinum silicide ($NiPt_ySi_x$), cobalt silicide ($CoSi_x$), tantalum silicide ($TaSi_x$), and titanium silicide ($TiSi_x$).

7. The method of claim 1, wherein the forming of the amorphous region in the semiconductor substrate by the angled ion implantation through the via opening into the exposed surface of the semiconductor substrate comprises implanting n-type dopants, p-type dopants, neutral conductivity type dopants, or a combination thereof.

8. The method of claim 1, wherein a remaining portion of the semiconductor substrate that is not amorphous has a single crystal or polycrystalline crystal structure.

9. The method of claim 1, wherein the forming of the metal containing material on the divot comprises a conformal deposition of a metal layer.

10. The method of claim 1, wherein the converting of the metal containing material and the portion of the semiconductor substrate adjacent to the divot into a metal semiconductor alloy contact comprises thermal annealing, wherein a remaining portion of the metal containing material that is not converted to the metal semiconductor alloy contact is removed using a selective etch.

11. The method of claim 1, wherein the interconnect is composed of a metal.

12. The method of claim 11, wherein the metal is selected from the group consisting of tungsten (W), aluminum (Al), copper (Cu), platinum (Pt), tantalum (Ta) and combinations thereof.

13. The method of claim 1, wherein the semiconductor substrate comprises a single crystal or polycrystalline material.

14. The method of claim 1, wherein the gate structure has a width ranging from 10 nm to 100 nm.

15. The method of claim 1, wherein the gate structure of the semiconductor device is separated from an adjacent gate structure of an adjacent semiconductor device by a pitch ranging from 60 nm to 200 nm.

16. The method of claim 1, wherein the forming of the amorphous region in the semiconductor substrate by angled ion implantation comprises an angle $\alpha$ ranging from 3° to 75°.

17. The method of claim 1, wherein the removing of the amorphous region to form the divot comprises a selective etch process that is selective to a material having a crystalline structure.

18. The method of claim 1, wherein the curvature of the divot relative to the centerline of the via opening is mushroom shaped.

19. The method of claim 1, wherein the convex curvature of a perimeter of the divot is non-uniform.

20. The method of claim 1, wherein the convex curvature has an oblong geometry.

* * * * *